(12) United States Patent  
Clark

(10) Patent No.: US 11,967,640 B2
(45) Date of Patent: Apr. 23, 2024

(54) CRYSTALLINE DIELECTRIC SYSTEMS FOR INTERCONNECT CIRCUIT MANUFACTURING

(71) Applicant: Tokyo Electron Limited, Tokyo (JP)

(72) Inventor: Robert D Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 17/234,347

(22) Filed: Apr. 19, 2021

(65) Prior Publication Data

US 2021/0328049 A1    Oct. 21, 2021

Related U.S. Application Data

(60) Provisional application No. 63/013,333, filed on Apr. 21, 2020.

(51) Int. Cl.

| | |
|---|---|
| *H01L 21/00* | (2006.01) |
| *H01L 21/02* | (2006.01) |
| *H01L 29/16* | (2006.01) |
| *H01L 29/20* | (2006.01) |
| *H01L 29/24* | (2006.01) |
| *H01L 29/76* | (2006.01) |

(52) U.S. Cl.
CPC .... *H01L 29/7606* (2013.01); *H01L 21/02115* (2013.01); *H01L 21/02488* (2013.01); *H01L 21/02532* (2013.01); *H01L 21/0254* (2013.01); *H01L 21/02546* (2013.01); *H01L 21/02568* (2013.01); *H01L 29/1606* (2013.01); *H01L 29/2003* (2013.01); *H01L 29/24* (2013.01)

(58) Field of Classification Search
CPC ......... H01L 21/02115; H01L 21/02488; H01L 21/02532; H01L 21/0254; H01L 21/02546; H01L 21/02568
See application file for complete search history.

(56) References Cited

U.S. PATENT DOCUMENTS

| | | | |
|---|---|---|---|
| 2002/0000556 A1* | 1/2002 | Sakamoto | H01L 21/76828 257/E21.292 |
| 2003/0057491 A1* | 3/2003 | Mitani | H01L 29/4908 257/E21.414 |
| 2004/0089885 A1* | 5/2004 | Martin | H01L 29/1033 257/E29.026 |

(Continued)

FOREIGN PATENT DOCUMENTS

KR    10-2017-0115175 A    10/2017

OTHER PUBLICATIONS

Korean Intellectual Property Office, The International Search Report and Written Opinion for International Application No. PCT/US2021/027978, dated Aug. 6, 2021, 11 pages.

*Primary Examiner* — Reema Patel

(57) ABSTRACT

A semiconductor device and method of forming. The semiconductor device contains microelectronic components embedded in a single crystalline dielectric material. The method of forming a semiconductor device includes providing a single crystalline substrate, epitaxially depositing a single crystalline dielectric material on the single crystalline substrate, and forming microelectronic components in the single crystalline dielectric material. The single crystalline dielectric material can contain carbon with a diamond structure or hexagonal boron nitride (h-BN) with a graphene structure.

6 Claims, 3 Drawing Sheets

(56) References Cited

U.S. PATENT DOCUMENTS

| | | | |
|---|---|---|---|
| 2009/0199887 A1* | 8/2009 | Johnson | H10N 19/00 |
| | | | 438/54 |
| 2015/0144881 A1 | 5/2015 | Seacrist et al. | |
| 2015/0372056 A1 | 12/2015 | Seong et al. | |
| 2017/0141008 A1* | 5/2017 | Antoniswamy | F28F 21/00 |
| 2018/0144934 A1* | 5/2018 | Dolzhnikov | C01B 19/007 |
| 2020/0109487 A1* | 4/2020 | Kim | C30B 29/68 |

* cited by examiner

CRYSTALLINE DIELECTRIC SYSTEMS FOR INTERCONNECT CIRCUIT MANUFACTURING

CROSS-REFERENCE TO RELATED APPLICATIONS

This application claims priority to U.S. Provisional Patent Application No. 63/013,333, filed Apr. 21, 2020, the disclosure of which is expressly incorporated herein, in its entirety, by reference.

FIELD OF INVENTION

The present invention relates to the field of semiconductor manufacturing and semiconductor devices, and more particularly, to formation of a monolithic 3-dimensional integrated circuit.

BACKGROUND OF THE INVENTION

As further scaling of semiconductor systems continues, area scaling is becoming increasingly difficult. In current generations of semiconductor devices, the bulk of the volume of the active integrated circuit (IC) is comprised of interlayer dielectrics (ILDs) that insulate the devices and interconnects from one another. In particular, various forms of silicon oxide are predominantly used for ILD layers. For example, high-density plasma oxide, TEOS based chemical vapor deposited oxides that are deposited at low or high temperatures, carbon doped oxides, and low-k oxides, are all used for various insulating oxides inside of integrated circuits. The ILD also plays a key role as a structural support for the wiring and devices used in the integrated circuit. The ILD is required to have sufficient mechanical hardness to withstand the stresses created during the manufacturing and packaging of integrated circuits. Further, in many cases the ILD is used as a structural mold to create interconnect structures. For example, the dual damascene integration frequently used to form Cu based interconnect structures relies on filling trenches and vias created in the ILD using electroplated Cu followed by chemical mechanical planarization (CMP) in order to form interconnect wires.

Current state of the art integrated circuits have or are approaching atomic scale feature sizes (defined as half of the pitch) and are therefore extremely difficult to fabricate. Due to the high density of interconnects and devices, self-heating phenomena are beginning to become major issues for integrated circuits. Because silicon oxides are insulators both in terms of electrical and heat conduction, it becomes difficult to transmit heat out of the devices and interconnect structures. Low dimensional metal lines are suffering from increasing resistance due to scattering of carriers by grain boundaries and by surfaces. This problem is exacerbated by conductive liners and diffusion barriers taking up a significant portion of many interconnect and device features resulting in still higher resistance. Further, low-k dielectrics, which are needed to reduce capacitance in interconnects in order to maintain low RC delay, are less mechanically robust than pure dense $SiO_2$, and therefore less resistant to the mechanical and thermal stresses applied during the integrated circuit manufacturing process which can impact the ability to yield working devices due to cracking, voiding, delamination, or other phenomena. Therefore, a more mechanically robust and more thermally conductive ILD systems than $SiO_2$ within highly scaled layers of the integrated circuit could provide a way to attain better performing IC devices.

Furthermore, future semiconductor devices will require using multiple layers of logic, memory and other devices within a single integrated circuit in order to provide increased performance at reduced power compared to the current highly scaled integrated circuits in production. One approach currently under investigation for multi-layer systems is to bond new device layers on top of already fabricated devices and continue building the integrated circuit on the newly bonded device layer. However, this approach results in several problems. Distortion of the underlying layer can limit interconnect density due to poor lithographic alignment from one layer to the next. In addition, bonding may require a thicker ILD between device layers and wiring layers, which also complicates alignment from one layer to the next. Thus, it is beneficial if a multi-layer system can be integrated monolithically.

SUMMARY OF THE INVENTION

Embodiments of the invention describe a semiconductor device and a method for forming a semiconductor device.

According to one embodiment, a semiconductor device includes microelectronic components embedded in a single crystalline dielectric material. The single crystalline dielectric material can, for example, contain carbon with a diamond structure or hexagonal boron nitride (h-BN) with a graphene structure.

According to one embodiment, a method of forming a semiconductor device includes providing a single crystalline substrate, epitaxially depositing a single crystalline dielectric material on the single crystalline substrate, and forming microelectronic components in the single crystalline dielectric material. The single crystalline dielectric material can, for example, contain carbon with a diamond structure or hexagonal boron nitride (h-BN) with a graphene structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiment of the invention describe the use of single crystalline ILDs that can replace $SiO_2$-based dielectric materials. The single crystalline ILDs may be indexed to the underlying crystalline substrate using epitaxial growth that is lattice matched with the underlying crystalline substrate. Furthermore, a single crystalline metal or a single crystalline semiconductor material may be deposited or grown on top of the single crystalline ILDs. Single crystalline metals can provide less grain boundary scattering and therefore lower electrical resistance. Single crystalline semiconductors can enable monolithic 3D integration of devices that can allow multiple levels of logic and memory devices to be built effectively at nanoscale dimensions. In other examples, a variety of 2D or other emerging materials may be epitaxially grown using the single crystalline ILDs as a virtual substrate.

The integration of epitaxial grown materials in microelectronic components may advantageously utilize selective and self-limited etch processes that are enhanced in terms of directionality and layer by layer control using single crystalline materials. Selective etching can be accomplished in a single crystalline material because different crystal orientations have different etch rates.

In general, epitaxial growth or epitaxial deposition refers to formation of crystalline layers with a well-defined orientation with respect to the underlying crystalline substrate. The relative orientation of the crystalline layer to the crystalline substrate is defined in terms of the orientation of the crystal lattice of each material. For epitaxial growth, the new layer will be crystalline and have a single orientation relative to the substrate. This is in contrast with amorphous growth or multicrystalline growth with random crystal orientation.

According to one embodiment, a single crystalline dielectric material may be used above the first level of logic or memory devices. The single crystalline dielectric material is effective in spreading/dissipating heat generated in the logic and memory devices, due to a higher thermal conductivity, especially in-plane thermal conductivity. Materials such as carbon with a diamond crystalline structure and hexagonal boron nitride (h-BN) in a graphene structure are examples of crystalline dielectric materials with high thermal conductivity that may be used for dissipating the heat. Further, air gap structures may be integrated into the single crystalline materials at some device levels to provide a low-k film effect by lowering the dielectric constant of moderate-k materials, while maintaining sufficient mechanical stability.

Figure 1:
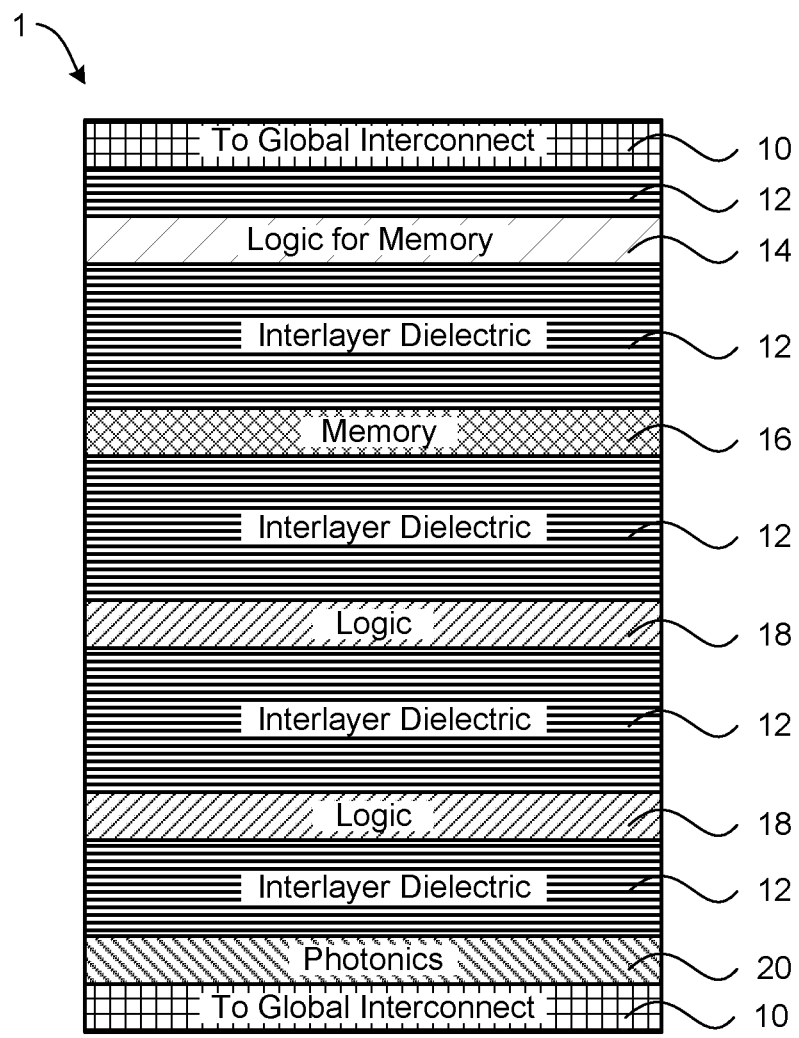
FIG. 1 schematically shows a monolithic stack of semiconductor devices integrated according to an embodiment of the invention.

FIG. 1 schematically shows a monolithic stack of semiconductor devices integrated according to an embodiment of the invention. The exemplary monolithic stack 1 contains different levels of logic 18, logic for memory 14, and memory 16 levels that are separated by single crystalline ILDs 12. The monolithic stack 1 further contains a photonic level 20 and components 10 for connecting the monolithic stack 1 to global interconnects in an integrated circuit.

Figure 2A:
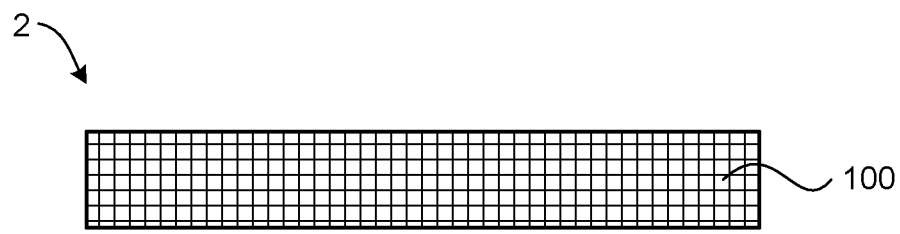
FIGS. 2A-2F schematically show a method for forming a monolithic stack of semiconductor devices according to an embodiment of the invention.

FIGS. 2A-2F schematically show a method for forming a monolithic stack of semiconductor devices according to an embodiment of the invention. FIG. 2A shows a substrate 2 containing a single crystalline substrate 100 that can, for example, include a crystalline Si wafer. Crystalline Si (c-Si) wafers that are nearly defect-free are used for the fabrication of integrated circuits and in photovoltaics to manufacture solar cells. Crystal orientation is defined by the Miller index with (100) or (111) faces being the most common for Si. The Si wafer serves as the substrate for microelectronic devices built in and upon the Si wafer. The Si wafer undergoes many microfabrication processes and the resulting individual microcircuits are separated by wafer dicing and packaged as an integrated circuit.

Figure 2B:
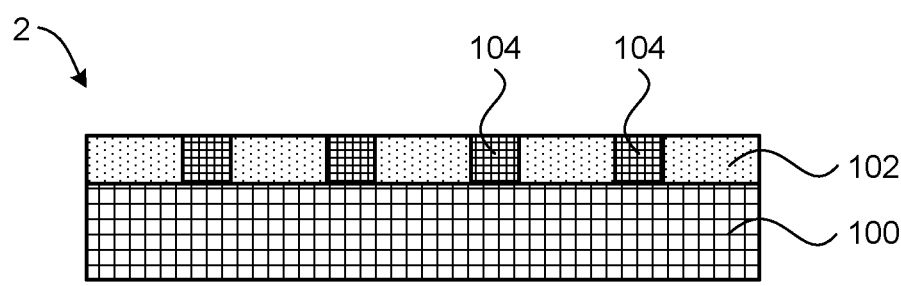

FIG. 2B shows the substrate 2 containing microelectronic components 104 in an amorphous oxide ILD 102 that may be used as a structural mold to manufacture the microelectronic components 104. The microelectronic components 104 may be epitaxially formed directly on the single crystalline substrate 100 between etched patterns in the amorphous oxide ILD 102 as depicted in FIG. 2B. The microelectronic components 104 can, for example, include microelectronic devices (e.g., transistors), metal interconnects (e.g., metal wirings), or a combination thereof.

Figure 2C:
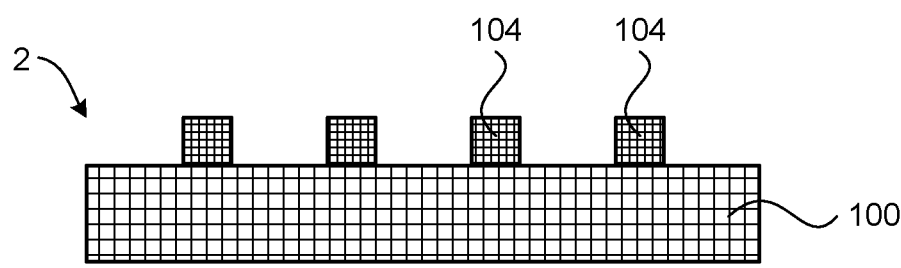

FIG. 2C shows the substrate 2 following removal of the amorphous oxide ILD 102, leaving the microelectronic components 104 on the single crystalline substrate 100. The removal of the amorphous oxide ILD 102 may be performed by wet etching or dry etching.

Figure 2D:
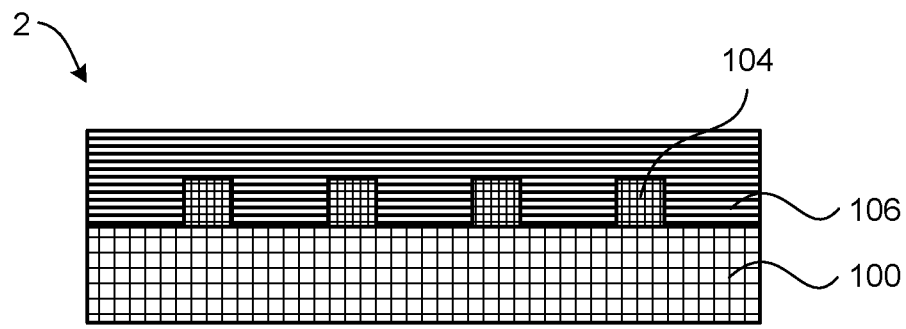

FIG. 2D shows the substrate 2 following epitaxial deposition of a single crystalline dielectric material 106 by vapor phase deposition on the microelectronic components 104 and on the single crystalline substrate 100. According to an embodiment of the invention, the single crystalline dielectric material 106 contains carbon with a diamond structure or hexagonal boron nitride (h-BN) with a graphene structure. As depicted in FIG. 2D, the single crystalline dielectric material 106 may fully encapsulate the microelectronic components 104 and extend above a top surface of the microelectronic components 104.

Figure 2E:
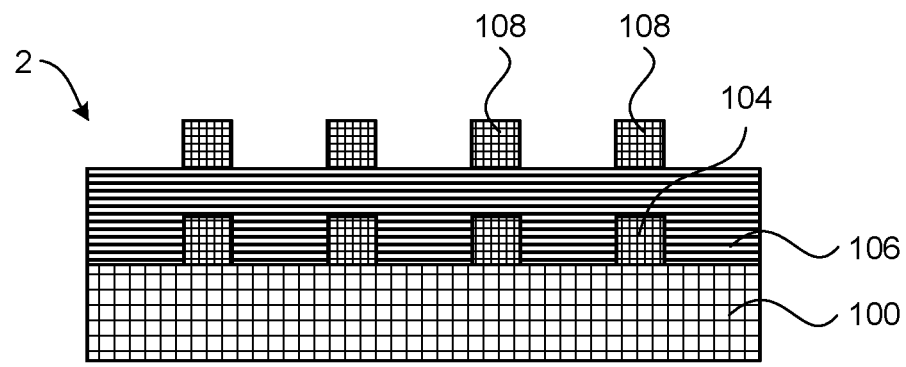

FIG. 2E shows the substrate 2 following formation of a patterned single crystalline layer 108 on the single crystalline dielectric material 106. The patterned single crystalline layer 108 can contain a single crystalline conducting material, a single crystalline semiconductor material, or a combination thereof. The patterned single crystalline layer 108 may be formed by epitaxial deposition followed by a patterning process and an etching process. The crystallinity of the single crystalline dielectric material 106 enables the epitaxial deposition with low defect density. The single crystalline conducting material may be selected from the group consisting of Cu, W, Ru, Mo, Co, graphene, a transition metal dichalcogenide, and combinations thereof. The single crystalline semiconductor material may be selected from the group consisting of c-Si, SiGe, Ge, GeSn, graphene, GaAs, InGaAs, GaN, a transition metal dichalcogenide (TMD), and combinations thereof. For example, III-V semiconductor layers are useful for photonics, Si or SiGe layers may be used for logic or memory devices, and TMD layers may be used for logic or memory devices.

TMD layers are atomically thin semiconductors of the type $MX_2$, where M is a transition metal atom (e.g., Mo or W) and X is a chalcogen atom (e.g., S, Se, or Te). One layer of M atoms is sandwiched between two layers of X atoms. They are part of the large family of so-called 2D materials, named so to emphasize their extraordinary thinness. For example, a $MoS_2$ monolayer is only 6.5 Å thick. The key feature of these materials is the interaction of large atoms in the 2D structure as compared with first-row transition metal dichalcogenides, e.g., $WTe_2$ exhibits anomalous giant magnetoresistance and superconductivity.

TMD layers may be combined with other 2D materials like to make van der Waals heterostructures. These heterostructures may be optimized as building blocks for many different devices such as transistors, solar cells, LEDs, photodetectors, fuel cells, photocatalytic and sensing devices. Like graphite, TMD bulk crystals are formed of monolayers bound to each other by Van-der-Waals attraction.

Figure 2F:
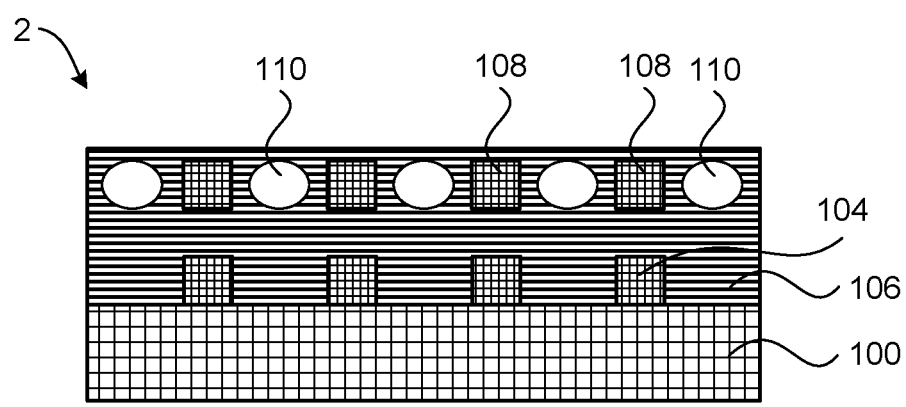

FIG. 2F shows the substrate 2 following further epitaxial deposition of the single crystalline dielectric material 106 to surround the patterned single crystalline layer 108. In the case of metal interconnects, stochastic (random) variability is reduced as well by having single crystal metal interconnects. Also shown are optional airgaps 110 formed in the single crystalline dielectric material 106, where the airgaps 110 lower the dielectric constant of the single crystalline dielectric material 106, and reduce the crosstalk of the patterned single crystalline layer 108.

A plurality of embodiments for crystalline dielectric systems for interconnect circuit manufacture have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of forming a semiconductor device, the method comprising:
 providing a single crystalline substrate;
 providing a patterned layer with etched patterns on the single crystalline substrate;
 epitaxially forming microelectronic components between the etched patterns of the patterned layer and on the single crystalline substrate, wherein the microelectronic components include microelectronic devices including transistors, interconnects including single crystalline metal, or a combination thereof;
 removing the patterned layer; and
 epitaxially forming a single crystalline dielectric material on the single crystalline substrate.

2. The method of claim 1, wherein the single crystalline dielectric material contains carbon with a diamond structure or hexagonal boron nitride (h-BN) with a graphene structure.

3. The method of claim 1, wherein the single crystalline dielectric material is epitaxially deposited on the single crystalline substrate by vapor phase deposition.

4. A method of forming a semiconductor device, the method comprising:
 providing a single crystalline substrate;
 providing a patterned layer with etched patterns on the single crystalline substrate;
 epitaxially forming microelectronic components between the etched patterns of the patterned layer and on the single crystalline substrate;
 removing the patterned layer;
 epitaxially forming a single crystalline dielectric material on the single crystalline substrate; and
 forming, on the single crystalline dielectric material, a single crystalline conducting material, a single crystalline semiconductor material, or a combination thereof.

5. The method of claim 4, wherein the single crystalline semiconductor material is selected from the group consisting of Si, SiGe, Ge, GeSn, graphene, GaAs, InGaAs, GaN, transition metal dichalcogenides, and combinations thereof.

6. The method of claim 5, wherein the transition metal dichalcogenides contain Mo or W and S, Se, or Te.

* * * * *